United States Patent
Yan et al.

(10) Patent No.: US 9,437,593 B2
(45) Date of Patent: Sep. 6, 2016

(54) SILICIDED SEMICONDUCTOR STRUCTURE AND METHOD OF FORMING THE SAME

(71) Applicant: Infineon Technologies AG, Neubiberg (DE)

(72) Inventors: Jiang Yan, Newburgh, NY (US);
Henning Haffner, Dresden (DE);
Frank Huebinger, Dresden (DE);
Sun-Oo Kim, Hopewell Junction, NY (US); Richard Lindsay, Beacon, NY (US); Klaus Schruefer, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/488,020

(22) Filed: Sep. 16, 2014

(65) Prior Publication Data

US 2015/0001638 A1    Jan. 1, 2015

Related U.S. Application Data

(62) Division of application No. 12/364,804, filed on Feb. 3, 2009, now Pat. No. 8,865,592.

(51) Int. Cl.
| | |
|---|---|
| *H01L 21/70* | (2006.01) |
| *H01L 27/06* | (2006.01) |
| *H01L 23/525* | (2006.01) |
| *H01L 29/06* | (2006.01) |
| *H01L 21/28* | (2006.01) |
| *H01L 29/49* | (2006.01) |

(52) U.S. Cl.
CPC ....... *H01L 27/0617* (2013.01); *H01L 23/5256* (2013.01); *H01L 29/0653* (2013.01); *H01L 29/4958* (2013.01); *H01L 21/28088* (2013.01); *H01L 29/4966* (2013.01); *H01L 2924/0002* (2013.01)

(58) Field of Classification Search
CPC .......... H01L 27/0617; H01L 29/0653; H01L 29/4958; H01L 29/4966; H01L 23/5256; H01L 21/28088
USPC ....... 257/209, 384, 388, 412, 413, 529, 755, 257/E23.149, E29.156, E29.161, E21.199
See application file for complete search history.

(56) References Cited

U.S. PATENT DOCUMENTS

| | | |
|---|---|---|
| 4,877,755 A | 10/1989 | Rodder |
| 5,891,785 A | 4/1999 | Chang |
| 6,787,464 B1 | 9/2004 | Cheek et al. |
| 2006/0157819 A1 | 7/2006 | Wu |
| 2006/0205133 A1 | 9/2006 | Trivedi et al. |
| 2007/0001241 A1 | 1/2007 | Lim et al. |
| 2007/0099326 A1 | 5/2007 | Hsu et al. |
| 2007/0222028 A1 | 9/2007 | Matsuoka et al. |
| 2008/0217735 A1 | 9/2008 | Chen et al. |
| 2009/0101989 A1* | 4/2009 | Chen .................. H01L 23/5256 257/379 |

* cited by examiner

*Primary Examiner* — Victor A Mandala
*Assistant Examiner* — Colleen E Snow
(74) *Attorney, Agent, or Firm* — Slater Matsil, LLP (57) ABSTRACT

A preferred embodiment includes a method of manufacturing a fuse element that includes forming a polysilicon layer over a semiconductor structure, doping the polysilicon layer with carbon or nitrogen, depositing a metal over the polysilicon layer; and annealing the metal and polysilicon layer to form a silicide in an upper portion of the polysilicon layer.

19 Claims, 6 Drawing Sheets

SILICIDED SEMICONDUCTOR STRUCTURE AND METHOD OF FORMING THE SAME

This is a divisional application of U.S. application Ser. No. 12/364,804, entitled "Silicided Semiconductor Structure and Method of Forming the Same" which was filed on Feb. 3, 2009 and is incorporated herein by reference.

TECHNICAL FIELD

The present invention relates generally to semiconductor devices and methods and, in a particular embodiment, to a silicided semiconductor structure and a method of forming the same.

BACKGROUND

Fuse elements, such as fuse links and program transistors, are programmable electronic devices that are employed in a wide variety of semiconductor applications. For example fuse links and program transistors may be employed to enable redundant memory cells in a memory array, to program a chip identification, or to customize integrated circuits after production.

A fuse is normally closed or linked. Programming the fuse means opening or blowing a fuse link located in the fuse, which results in a significant increase in resistance. In contrast an anti-fuse is normally open, e.g., the fuse has a capacitor like structure. Programming the anti-fuse means closing the capacitor like structure of the anti-fuse which results in a short or decrease in resistance.

There are several different types of fuses and anti-fuses. One type of conventional fuse includes an electrically programmable fuse. This electrically programmable fuse may include a polysilicon/silicide stack. The polysilicon/silicide stack typically includes polycrystalline silicon and an overlayer of silicide.

SUMMARY OF THE INVENTION

In accordance with a preferred embodiment, the present invention includes a method of forming a semiconductor device. The method of manufacturing a fuse element comprises forming a polysilicon layer over a semiconductor structure, doping the polysilicon layer with carbon or nitrogen, depositing a metal over the doped polysilicon layer; and annealing the metal and polysilicon layer to form a silicide in an upper portion of the polysilicon layer.

The details of one or more embodiments of the invention are set forth in the accompanying drawings and the description below. Other features, objects and advantages of the invention will be apparent from the description, the drawings and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
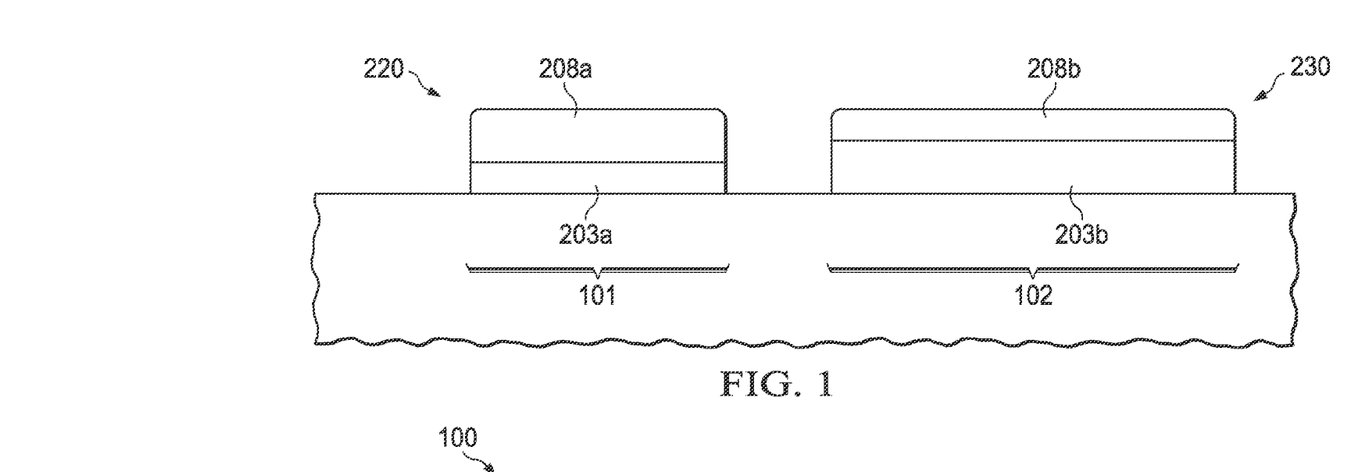
FIG. 1 shows a detailed view of a top portion of a polysilicon structure.

The present invention will be described with respect to preferred embodiments in a specific context, namely a semiconductor device including a fuse element and a method to manufacture a semiconductor device, especially a fuse element. FIG. 1 shows an example structure while FIGS. 2 through 7 show cross sectional views of a semiconductor device 100 at various stages of manufacturing in accordance with a preferred embodiment of the present invention.

FIG. 1 provides a first example of a structure that utilizes aspects of the present invention. In particular, this view shows a first region 101 and a second region 102 of a semiconductor device that includes a first structure 220 and a second structure 230. In this embodiment, a polysilicon layer 203 has been processed to form a first polysilicon structure 203*a* and a second polysilicon structure 203*b* over a workpiece, which can include any type of substrate, such as a semiconductor wafer or other. A silicide layer 208 is formed so that first silicide structure 208*a* overlies the first polysilicon structure and a second silicide structure 208*b* overlies the second polysilicon structure 203*b*. Preferably, the thickness of the first silicide structure 208*a* is greater than the thickness of the second silicide structure 208*b*. In one example, the first silicide structure entirely consumes the underlying polysilicon while the second silicide structure does not.

In one example, as will be discussed in greater detail below, the first structure 220 is the gate of a transistor while the second structure 230 is a fuse element. In fuse technology, it is important that a sufficient thickness of polysilicon be retained to ensure that the fuse will operate properly. This is especially important in smaller technology nodes. For example, in order to continue using a polysilicon fuse at feature sizes of 32 nm and below, some innovation is needed to avoid fully siliciding the polysilicon when the polysilicon thickness is reduced to 500 Å or below.

In one embodiment, the desired structure can be obtained by performing a special doping into the polysilicon in the eFuse area to control the final silicide thickness and properties. This doping can slow down the silicidation rate to avoid the fully silicided issue. As will be shown, the special doping can be tailored to have no impact on other areas of a chip, including a logic device, SRAM cells and resistor structures. In fact, it is possible to change the property of silicide for easy electro-migration without adversely affecting other structures.

In view of the processing, the silicidation rate at the first polysilicon layer 203a in the first region 220 is different than the silicidation rate of the second polysilicon layer 203b in the second region 230. The dopants, for example, carbon or nitrogen, slow down the silicidation rate at the second polysilicon layer 203b resulting in a different thickness of the silicide layer 208 over the first polysilicon layer 203a at the transistor 220 than over the second polysilicon layer 203b over the fuse element 230. Accordingly, the silicide formation may consume more polysilicon in the polysilicon layer 203 of the transistor 220 than the in the polysilicon layer 203 of the fuse element 230.

In various embodiments, the ratio of the silicide thickness for the thicker silicide to the silicide thickness for the thinner silicide may be greater than 1.1, e.g., a range from about 1.1 to about 1.5. In another embodiment, the ratio is greater than 1.2. The ration of the polysilicon vs. silicide for the transistor and polysilicon vs. silicide for the fuse will depend upon the technology node. For example, for 32 nm and 60 nm technology nodes, the ratio of polysilicon vs. silicide for the transistor is about 1.18 and 0.85 for the ratio polysilicon vs. silicide for the fuse.

Figure 2:
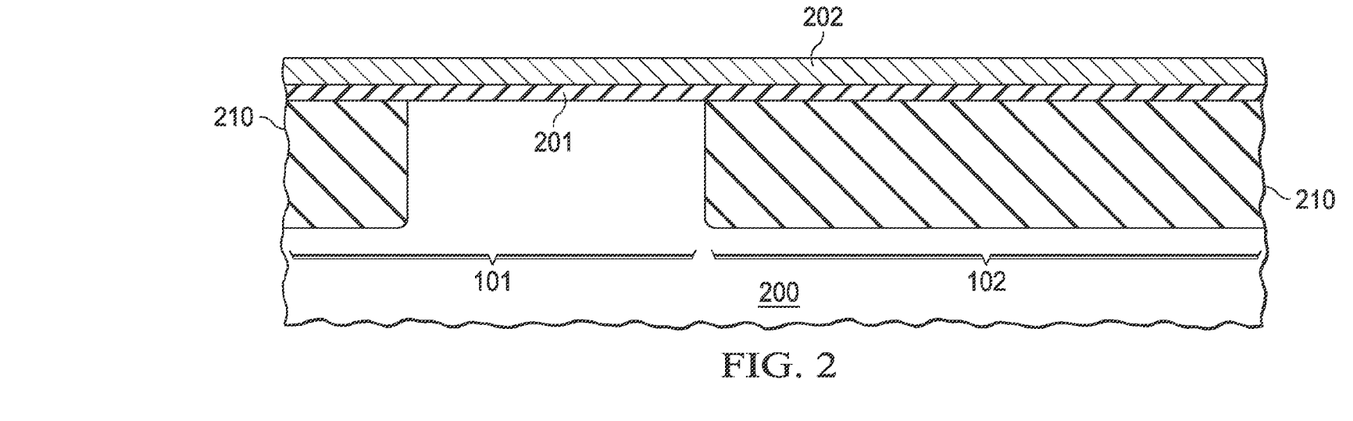
FIG. 2 shows a cross sectional view of a semiconductor device separated in a first region and a second region.

A preferred embodiment method will now be described with respect to FIGS. 2-7. FIG. 2 shows a semiconductor body 100, which has a first region 101 and a second region 102. The semiconductor body 100 may include a semiconductor substrate 200 which may include bulk silicon, silicon on insulator (SOI), compound semiconductors such as GaAs, InP, Si/Ge or SiC or any other suitable material.

Isolation regions 210 are formed within the semiconductor substrate 200. The isolation regions 210 provide electrical isolations between various regions of the semiconductor substrate 200. In one embodiment, the isolation regions are typically shallow trench isolations (STI), or isolation trenches (TI). In an alternate embodiment, field oxide or deep trench isolation can be used, as just two examples.

A dielectric layer 201 is formed overlying the semiconductor substrate 200. The dielectric layer may include traditional insulating materials used for gate dielectrics, such as silicon dioxide ($SiO_2$), silicon nitride ($Si_xN_y$) or silicon oxynitride (SiON) or a combination of. However, embodiments of the present invention may also, or alternatively, use high-k materials with a dielectric constant of about 15 or greater. Thus, the dielectric layer 201 may include $HfO_2$, HfSiOx, $Al_2O_3$, $ZrO_2$, $Si_xN_y$, SiON, as examples. The dielectric layer 201 may comprise a single layer of material, or alternatively, two or more layers. The dielectric layer 201 may be formed by chemical vapor deposition (CVD), atomic layer deposition (ALD), metal organic chemical vapor deposition (MOCVD), physical vapor deposition (PVD), or jet vapor deposition (JVD), as examples, although alternatively, the dielectric layer 201 may be formed using other techniques. The dielectric layer preferably includes a thickness of about 50 Angstroms or less in one embodiment, although alternatively, the dielectric layer 201 may include other dimensions, such as about 80 Angstroms or less. The dielectric layer 201 preferably includes about 20 to 30 Angstroms physical thickness.

A conductive layer 202 overlies the dielectric layer 201. The conductive layer 202 may include doped silicon, Ti, TiN, Ta, or TaN. Alternatively, the conductive layer may include other metal materials. The conductive layer 202 is preferably deposited using MOCVD in one embodiment, although alternatively, the conductive layer 202 may be formed by ALD, PVD or other deposition techniques. This is an optional step that is not required in embodiments of the present invention but may be appropriate for some transistor designs.

Figure 3A:
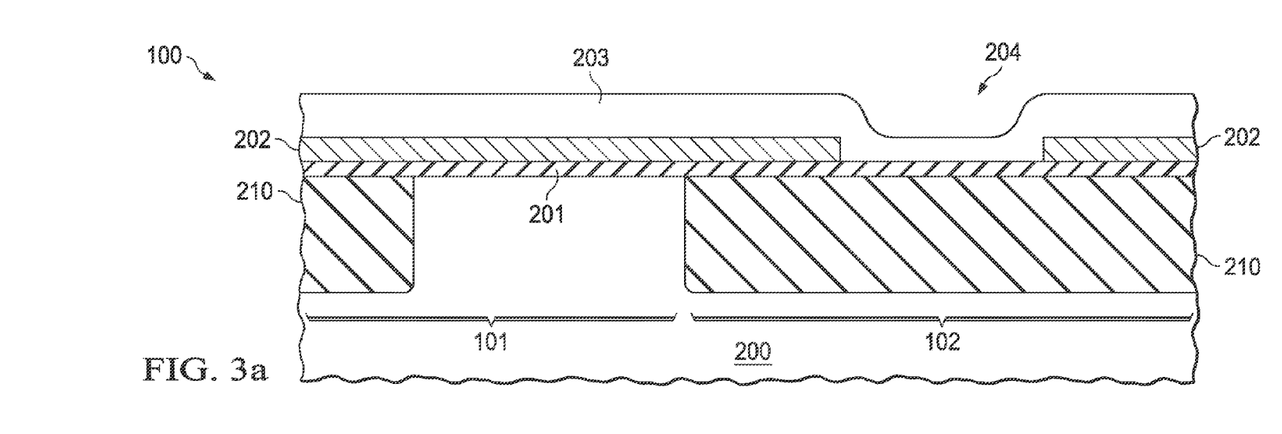
FIGS. 3*a* and 3*b* provide a cross sectional view of two preferred embodiments of the semiconductor device.

FIG. 3a illustrates an embodiment of a semiconductor device 100. An opening 204 is formed into the conductive layer 202 and, optionally, into the dielectric layer 201 in the second region 102 of the semiconductor device 100. The opening 204 is formed by an etch process, for example, a dry etch or, alternatively, by a wet etch. In a preferred embodiment the etch process removes the conductive layer 202. Alternatively, the etch process may remove the conductive layer 202 and the dielectric layer 201.

A polysilicon layer 203 is then deposited over the conductive layer 202 and the opening 204, filling the opening. The polysilicon layer 203 is preferably deposited by a chemical vapor deposition (CVD) process. The polysilicon layer 203 preferably includes a thickness of about 600 Angstroms or less in one embodiment, although alternatively, the polysilicon layer 203 may include other dimensions, such as about 500 Angstroms or less. In other embodiments, the polysilicon layer 203 preferably has a thickness from about 200 to 800 Angstroms.

Figure 3B:
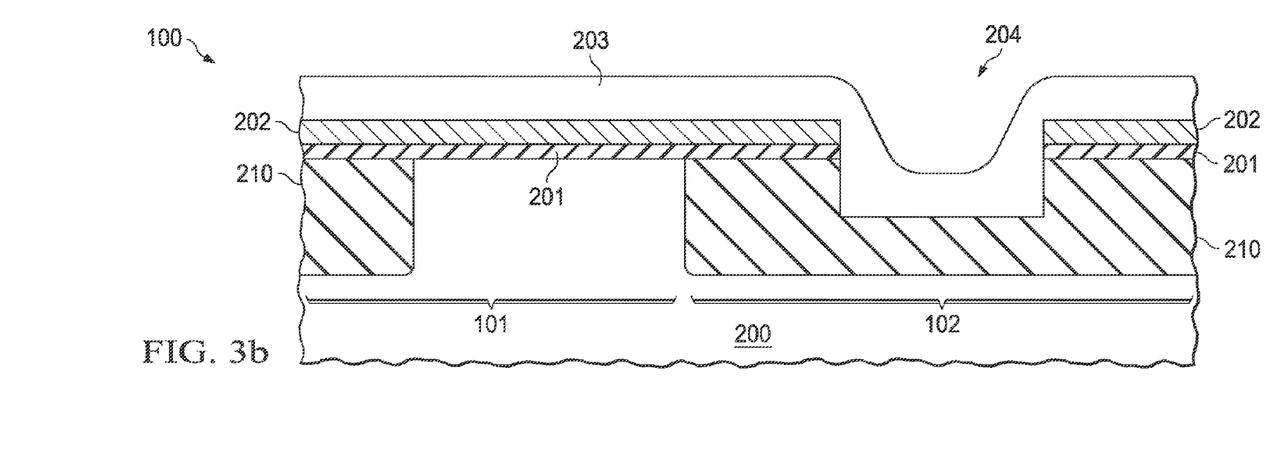

Referring now to FIG. 3b, in an alternate embodiment, an opening 204 is formed into the conductive layer 202, the dielectric layer 201 and the isolation region 210 in the second region 102 of the semiconductor device 100. The opening 204 is formed by an etch process and followed by an optional deposition of a dielectric layer, not shown, on the bottom and the sidewalls of the opening 204. The dielectric layer may include silicon dioxide ($SiO_2$), silicon nitride ($Si_xN_y$), silicon oxynitride (SiON) or any other suitable material. Polysilicon is then deposited over the conductive layer 202 and the optional dielectric layer, filling the opening, and forming a polysilicon layer 203.

Figure 4A:
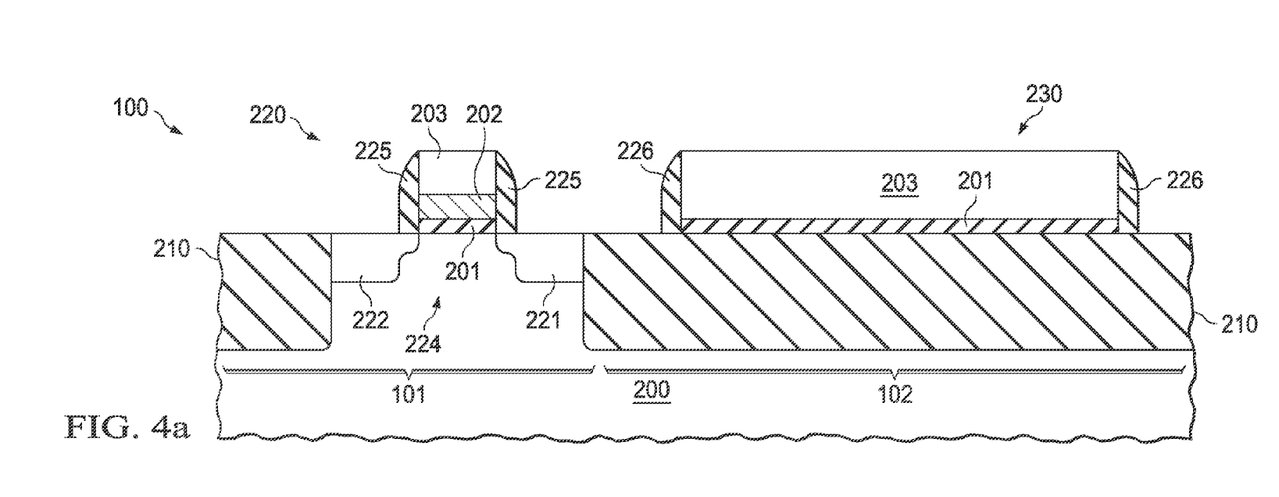
FIG. 4*a* shows a cross sectional view of the semiconductor device, wherein a first region comprises a transistor and a second region comprises a fuse element.

FIG. 4a illustrates a cross sectional view of the semiconductor substrate 200 after further processing. A transistor 220 is formed between isolation region 210 in the first region 101 and may include a first and second source/drain region 221, 222, a channel region 224 between the first and second source/drain region 221, 222, a gate dielectric 201 overlying the channel region 224, a metal layer 202 overlying the gate dielectric 201, and a polysilicon gate 203 overlying the metal layer 202. Spacers 225 may be formed on either side of the transistor stack. A fuse element 230 is formed in the second region 102 and may include an isolation layer 201 beneath polysilicon layer 203. At the opposite ends spacers 226 may be formed.

The transistor 220 and the fuse element 230 are formed using traditional depositing, patterning, etching and removing techniques. By using these techniques, in one embodiment, the conductive layer 202 is completely removed in the first region 101. In another embodiment, the polysilicon layer 203 is disposed over the conductive layer 202 and both layers form a gate region for a transistor.

Figure 4B:
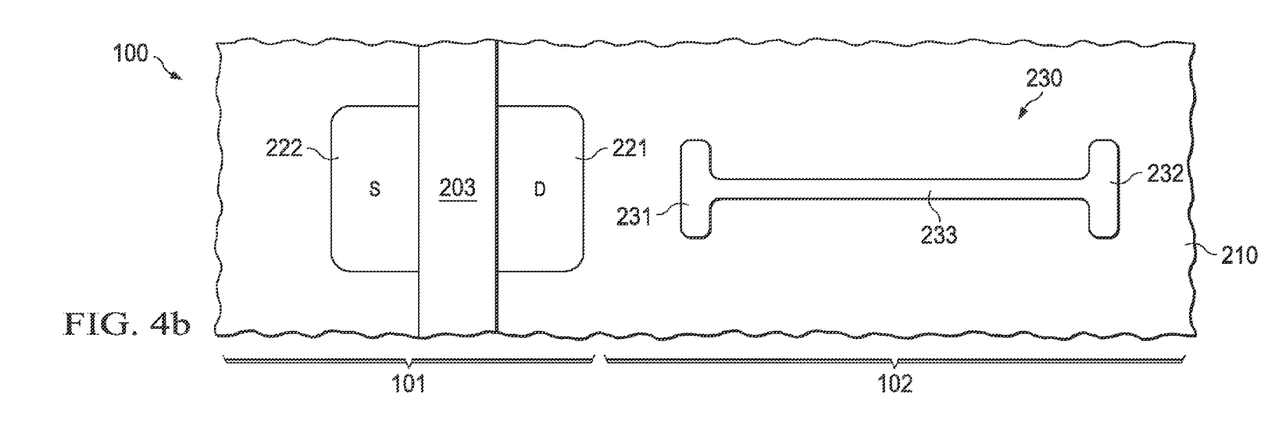
FIG. 4*b* provides a top view of the semiconductor device, wherein a first region comprises a transistor and a second region comprises a fuse element.

For example, a mask, e.g., photoresist can be formed over the wafer. The mask can then be patterned photolithographically to form the transistor gates (one is shown in the figure) and the fuses (again only one is shown). An example of a pattern of the gate conductor and fuse is shown in FIG. 4b, which illustrates a top view of the cross section of FIG. 4a. The fuse element 230 may include an anode 231, a cathode 232 and a fuse link 233. In a preferred embodiment, the anode 231, the cathode 232, and the fuse link 233 may all be from the same material. In other preferred embodiments, the anode 231, the cathode 232 may be from a different material than the anode 231 and the fuse link 233. Alternatively, other material combinations are possible.

Standard CMOS processing can then be performed to form the transistor. Lightly doped source/drain regions are formed by doping the exposed portions of source/drain regions 221, 222. Sidewall spacers can then be formed adjacent the gate, e.g., by conformal deposition of an insulating material (e.g., an oxide, nitride or combination of oxide and nitride) followed by anisotropic etching. The source/drain regions can then be completed by ion implantation and activation.

While FIGS. 4a and 4b provide one example of a resulting structure, it is understood that various options are available. For example, the metal portion 202 of the gate can be eliminated so that a polysilicon gate structure is included. Also various shapes and configurations for the various components can be used.

Figure 5:
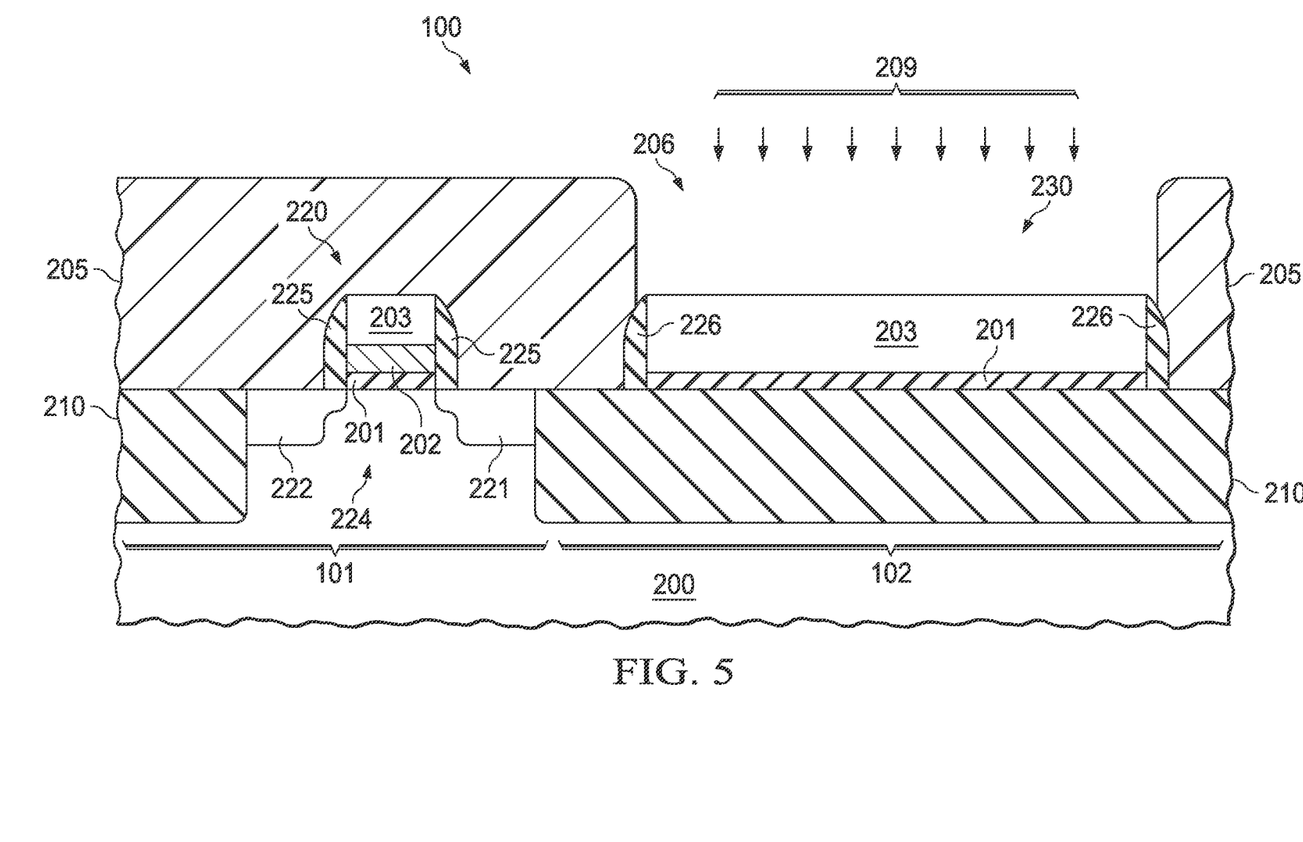
FIG. 5 and FIG. 6 show cross sectional views of the semiconductor device at various stages of manufacturing in accordance with a preferred embodiment of the present invention, wherein a polysilicon is formed, doped and formed over the fuse element.

Referring now to FIG. 5, processing of the semiconductor device 200 is continued. A mask 205 is formed over the transistor 220 and the fuse element 230. The mask 205 is preferably photoresist but may also be a hard mask such as boron-doped silicon glass (BSG), tetraethoxysilane (TEOS), as examples. The mask 205 may be patterned using traditional lithography techniques. An opening 206 is formed into the mask 205 in the second region 102 above the fuse element 230. The opening exposes at least parts of the polysilicon layer 203 of the fuse link 233 and preferably the whole area of fuse element 230 including fuse link 233, anode 231, and cathode 232).

In a preferred embodiment dopants 209 may be introduced into the polysilicon 203. Typical dopants may be carbon or nitrogen. Alternatively, germanium can be used. The dopants form a dopant concentration in the upper part of the polysilicon 203. The implantation is performed at an energy level of about 5 to 20 keV and at an implantation dose of about $10^{10}$ to about $10^{13}$ dopants/cm$^2$, as examples. Dopant concentration and distribution in the polysilicon 203 depend on the energy level and the duration of the doping process. In another embodiment, the implantation of the dopants may be performed under an angle so that the dopant concentration at the side walls of the fuse link 233 is higher than in the middle part of the upper area of the link. As described in more detail below, the doping of the polysilicon in the second region 102 may control the final silicide thickness and the property of the fuse element 230. Selective doping of only parts of the fuse link 233, for example, can also change the property of the fuse element 230 so that electro migration issues are eased.

Figure 6:
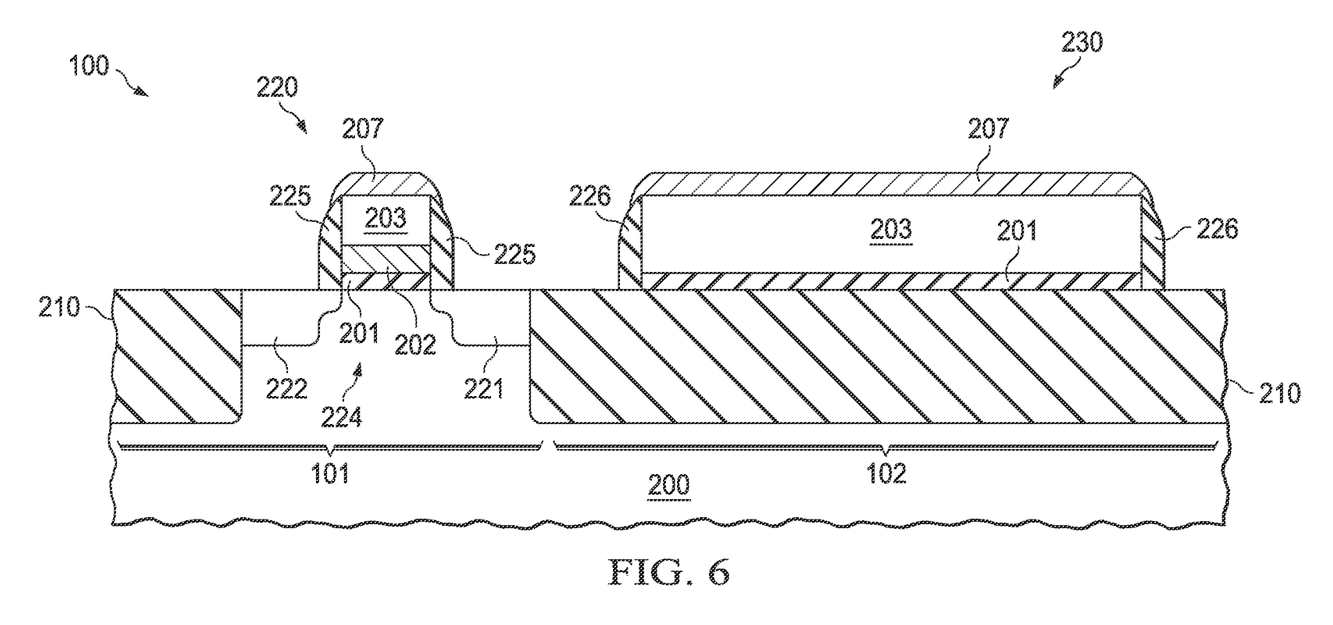

In FIG. 6 the mask 205 is removed from the semiconductor substrate 200. Next, in a preferred embodiment, a siliciding metal layer 207 is deposited over the polysilicon layer 203 of the transistor 220 in the first region 101 and the polysilicon layer 203 of the fuse element 230 in the second region 102 as well as the source/drain regions 221, 222. In the preferred embodiment, a self-aligned silicide or salicide process is used so the siliciding metal is blanket deposited over the entire wafer. The metal may include Ti, Ta, Pd, Cu, Ni, Pt, preferably Ni and Pt.

Figure 7:
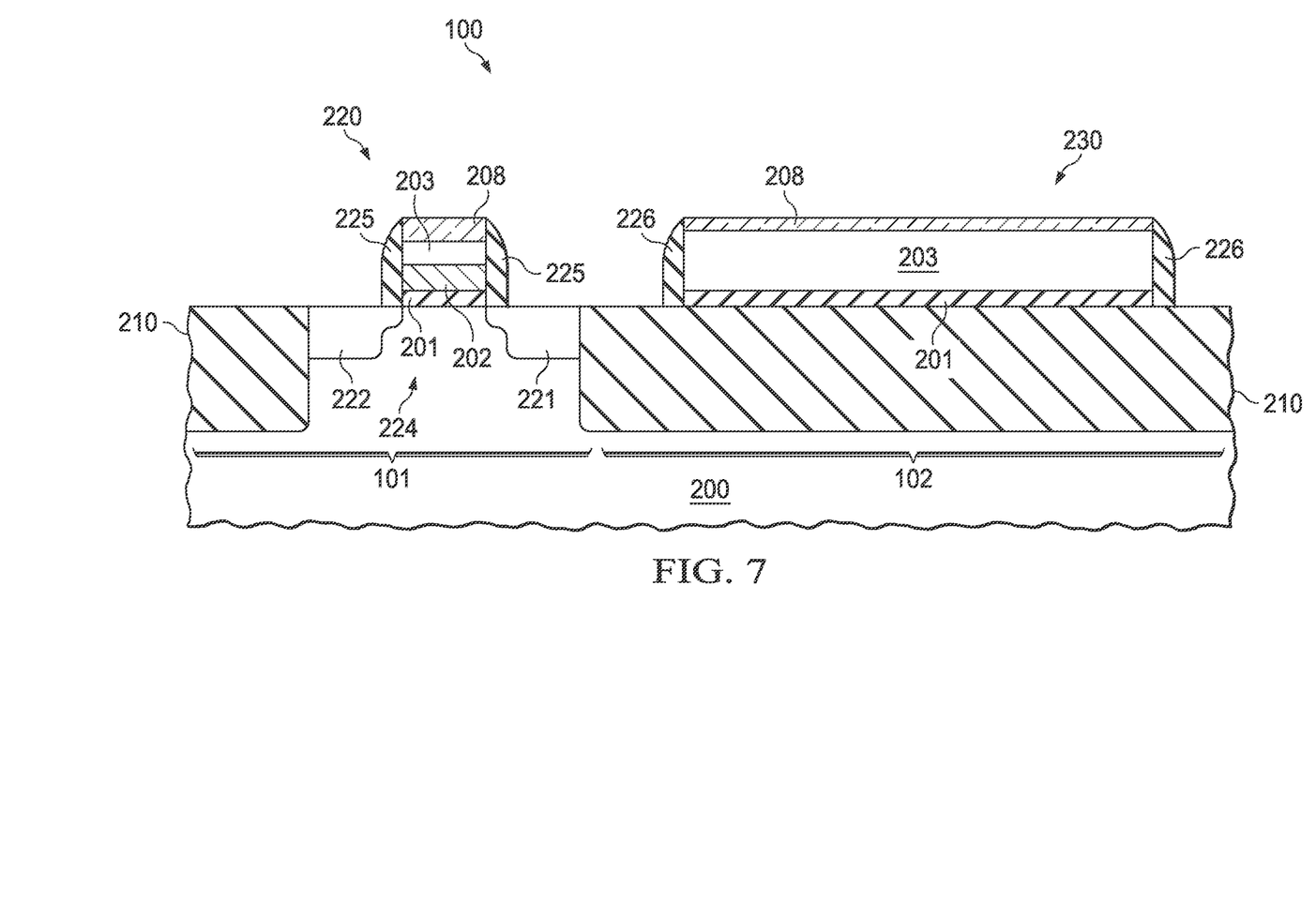
FIG. 7 shows a cross sectional view of a semiconductor device in accordance with a preferred embodiment of the present invention, wherein the gate polysilicon of the transistor and the polysilicon of the fuse element are silicided.

Then the semiconductor device 100 is annealed so that the siliciding metal layer 207 and the polysilicon layer 203 form a silicide layer 208 as can be seen in FIG. 7. In one embodiment the annealing step is performed with a low temperature annealing process. The temperatures are preferable between about 300° C. and 500° C. The low temperature process is typically carried out for about 20 minutes. In another embodiment the annealing step is performed with a high temperature annealing process. The temperatures for a high temperature annealing process are preferably between about 400° C. and 600° C. The high temperature process is typically carried out for about ten minutes.

By controlling the foregoing parameters, doping the polysilicon, depositing a siliciding metal and annealing the doped polysilicon/siliciding metal stack, the properties of the resulting silicide can be changed for different layouts of the fuse element 230 to provide easy electro-migration.

It should be noted that in a further embodiment the semiconductor device may include a memory, a capacitor, a MEMS or any other semiconductor devices.

Advantages of the preferred embodiments of the present invention include providing functional fuse elements for processing nodes smaller than 65 nm while process simplicity is ensured. The doping of the polysilicon with appropriate dopants may ensure that silicidation at the fuse element is slow, which in turn may prevent the fuse element and especially the fuse link from becoming fully silicided.

A further advantage is process economy. The doping of the fuse element adds just one additional step to the process work flow providing cost advantages for integrating fuse links into semiconductor devices.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a transistor at a surface of a semiconductor body, the transistor comprising:
      a first source/drain region;
      a second source/drain region;
      a channel region between the first and second source/drain regions;
      a gate dielectric overlying the channel region; and
      a gate overlying the gate dielectric, the gate comprising a first silicide layer and a metal layer disposed between the gate dielectric and the first silicide layer, the first silicide layer having a first thickness; and
   a fuse element disposed at the surface of the semiconductor body, the fuse element comprising a dielectric layer, a polysilicon layer and a second silicide layer having a second thickness that is smaller than the first thickness, wherein the fuse element does not comprise a metal layer having a metal material that is the same as a metal material of the metal layer of the transistor.

2. The semiconductor device of claim 1, wherein the ratio between the first thickness and the second thickness is about 1.1 to 1.5.

3. The semiconductor device of claim 1, wherein the polysilicon layer of the fuse element is doped with carbon or nitrogen.

4. The semiconductor device of claim 1, wherein the gate of the transistor further comprises a polysilicon layer between the gate dielectric and the first silicide layer.

5. The semiconductor device of claim 1, wherein the fuse element overlies an isolation structure, the isolation structure abutting the first source/drain region.

6. The semiconductor device of claim 5, wherein the fuse element is partially recessed within the isolation structure.

7. The semiconductor device of claim 1, wherein the polysilicon layer of the fuse element is disposed on and physically contacts the dielectric layer.

8. A semiconductor device comprising:
a transistor at a surface of a semiconductor body, the transistor comprising:
a first source/drain region;
a second source/drain region;
a channel region between the first and second source/drain regions;
a gate dielectric overlying the channel region; and
a gate overlying the gate dielectric, the gate comprising a metal layer, a polysilicon layer, and a silicide layer, the silicide layer having a first thickness; and
a fuse element disposed at the surface of the semiconductor body, the fuse element comprising a polysilicon layer and a silicide layer having a second thickness that is smaller than the first thickness, wherein the fuse element further comprises a dielectric layer between the polysilicon layer and semiconductor body, and wherein a dielectric material of the dielectric layer of the fuse element and a dielectric material of the gate dielectric are the same, wherein the fuse element does not comprise a metal layer having a metal material that is the same as a metal material of the metal layer of the transistor.

9. The semiconductor device of claim 8, wherein the ratio between the first thickness and the second thickness is about 1.1 to 1.5.

10. The semiconductor device of claim 8, wherein the polysilicon layer of the fuse element is doped with carbon or nitrogen.

11. The semiconductor device of claim 8, wherein the fuse element overlies an isolation structure, the isolation structure abutting the first source/drain region.

12. The semiconductor device of claim 8, wherein a silicide material of the silicide layer of the fuse element and a silicide material of the silicide layer of the transistor are the same.

13. The semiconductor device of claim 8, wherein the fuse element is partially recessed within a isolation structure.

14. A semiconductor device comprising:
a transistor disposed at a first region of a surface of a semiconductor body, the transistor comprising:
a first source/drain region;
a second source/drain region;
a channel region between the first and second source/drain regions;
a gate dielectric overlying the channel region; and
a gate overlying the gate dielectric, the gate comprising a first silicide layer and a metal layer disposed between the gate dielectric and the first silicide layer, the first silicide layer having a first thickness; and
a fuse element disposed at a second region of the surface of the semiconductor body, the fuse element comprising:
an isolation structure located in the semiconductor body;
a dielectric layer overlying the isolation structure;
a polysilicon layer overlying the dielectric layer, wherein the polysilicon layer of the fuse element is disposed over and physically contacts the dielectric layer; and
a second silicide layer overlying the polysilicon layer, wherein the fuse element is located adjacent to the transistor such that the isolation structure abuts the first source/drain region, wherein the fuse element does not comprise a metal layer having a metal material that is the same as a metal material of the metal layer of the transistor.

15. The semiconductor device of claim 14, wherein the second silicide layer is disposed over and physically contacts the polysilicon layer.

16. The semiconductor device of claim 14, wherein the polysilicon layer of the fuse element is doped with carbon.

17. The semiconductor device of claim 14, wherein the polysilicon layer of the fuse element is doped with nitrogen.

18. The semiconductor device of claim 14, wherein the second silicide layer has a second thickness that is smaller than the first thickness.

19. The semiconductor device of claim 18, wherein the ratio between the first thickness and the second thickness is about 1.1 to 1.5.

* * * * *